(12) United States Patent
Kim

(10) Patent No.: US 9,111,762 B2
(45) Date of Patent: Aug. 18, 2015

(54) SEMICONDUCTOR DEVICE AND METHOD FOR MANUFACTURING THE SAME

(71) Applicant: SK hynix Inc., Gyeonggi-do (KR)

(72) Inventor: Myoung Sub Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/098,176

(22) Filed: Dec. 5, 2013

(65) Prior Publication Data

US 2015/0069582 A1 Mar. 12, 2015

(30) Foreign Application Priority Data

Sep. 6, 2013 (KR) .................. 10-2013-0106931

(51) Int. Cl.
*H01L 29/06* (2006.01)
*H01L 21/265* (2006.01)
*H01L 29/417* (2006.01)
*H01L 29/66* (2006.01)
*H01L 29/78* (2006.01)
*H01L 29/08* (2006.01)

(52) U.S. Cl.
CPC .............. *H01L 29/06* (2013.01); *H01L 21/265* (2013.01); *H01L 21/26553* (2013.01); *H01L 21/26586* (2013.01); *H01L 29/0847* (2013.01); *H01L 29/41741* (2013.01); *H01L 29/66666* (2013.01); *H01L 29/7827* (2013.01)

(58) Field of Classification Search
CPC ............... H01L 29/06; H01L 29/0657; H01L 2924/01079; H01L 2924/14; H01L 2224/16
USPC ..................... 257/72, 622, E45.002
See application file for complete search history.

(56) References Cited

U.S. PATENT DOCUMENTS

| | | | | |
|---|---|---|---|---|
| 5,072,276 A * | 12/1991 | Malhi et al. | ................... | 257/372 |
| 2009/0148991 A1* | 6/2009 | Chung et al. | .................. | 438/268 |
| 2010/0270611 A1* | 10/2010 | Masuoka et al. | .............. | 257/329 |
| 2011/0266615 A1* | 11/2011 | Oyu et al. | ..................... | 257/329 |
| 2013/0134506 A1* | 5/2013 | Yagishita | ....................... | 257/330 |
| 2013/0140627 A1* | 6/2013 | Masuoka et al. | .............. | 257/329 |
| 2013/0214417 A1* | 8/2013 | Lazzari et al. | ................. | 257/754 |

FOREIGN PATENT DOCUMENTS

KR 1020140145777 12/2014

* cited by examiner

*Primary Examiner* — Phuc Dang
(74) *Attorney, Agent, or Firm* — IP & T GROUP LLP

(57) ABSTRACT

A semiconductor device includes a semiconductor substrate, a plurality of pillars vertically extending from the semiconductor substrate, each pillar including a groove formed in an upper surface thereof, a salicide layer formed to cover the upper surface and a lateral circumference of an upper end of each pillar and a lower electrode formed to cover an upper surface and a lateral surface of the salicide layer.

16 Claims, 12 Drawing Sheets

SEMICONDUCTOR DEVICE AND METHOD FOR MANUFACTURING THE SAME

CROSS-REFERENCES TO RELATED APPLICATION

This application claims priority under 35 U.S.C. 119(a) to Korean application No. 10-2013-0106931, filed on Sep. 6, 2013, in the Korean intellectual property Office, which is incorporated by reference in its entirety as set forth in full.

BACKGROUND

1. Technical Field

Various embodiments of the inventive concept relate to a semiconductor device and a method for manufacturing the same, and more particularly, to a semiconductor device having a vertical transistor and a method for manufacturing the same.

2. Related Art

With increase in the integration degree of semiconductor devices, a channel length of a transistor becomes reduced. The reduced channel length causes short channel effects such as Drain Induced Barrier Lowering (DIBL), a hot carrier effect and punch-through.

For resolving the concerns, solutions are suggested as reducing a length of a junction region and increasing the channel length by forming a recess in a channel region of a transistor.

However, as the integration degree increases due to the semiconductor devices with the capacity of giga bits, it becomes difficult to satisfy the desired device area of a flat structure of transistor, in which junction regions are formed at both sides of a gate electrode, in spite of the scaled down channel length. Therefore, to resolve the concern, a vertical channel transistor is suggested.

A semiconductor device having a vertical channel transistor in the related art will be described with reference to FIG. 4.

The semiconductor device in the related art includes a plurality of pillars 215 vertically extending from a semiconductor substrate 210, a gate insulating layer 230 surrounding a lower lateral surface of each pillar 215, a gate electrode 240 surrounding each pillar 115 surrounded with the gate insulating layer 230 and a spacer 250 surrounding an upper lateral surface of the pillar 215. A silicide layer 280 is formed on an upper surface of the pillar 215 and a lower electrode 290 is formed on the silicide layer 280.

With trend of shrinkage in the semiconductor device having the vertical channel transistor such as a phase-change random access memory (PCRAM), difficulty in a process is seriously increased. In the semiconductor device of 20 nm or less, ON current is reduced due to increase in a contact resistance by the shrinkage trend.

Therefore, in the recent semiconductor devices, there is a need for increasing the ON current by reducing the contact resistance.

SUMMARY

One or more exemplary embodiments are provided to a semiconductor device capable of increasing ON current by reducing a contact resistance in fabricating the semiconductor device and a method for manufacturing the same.

According to an embodiment, there is provided a semiconductor device. The semiconductor device may include a semiconductor substrate, a plurality of pillars vertically extending from the semiconductor substrate, each pillar including a groove formed in an upper surface thereof, a self-aligned silicide (salicide) layer formed to cover the upper surface and a lateral circumference of an upper end of each pillar and a lower electrode formed to cover an upper surface and a lateral surface of the salicide layer.

These and other features, aspects and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
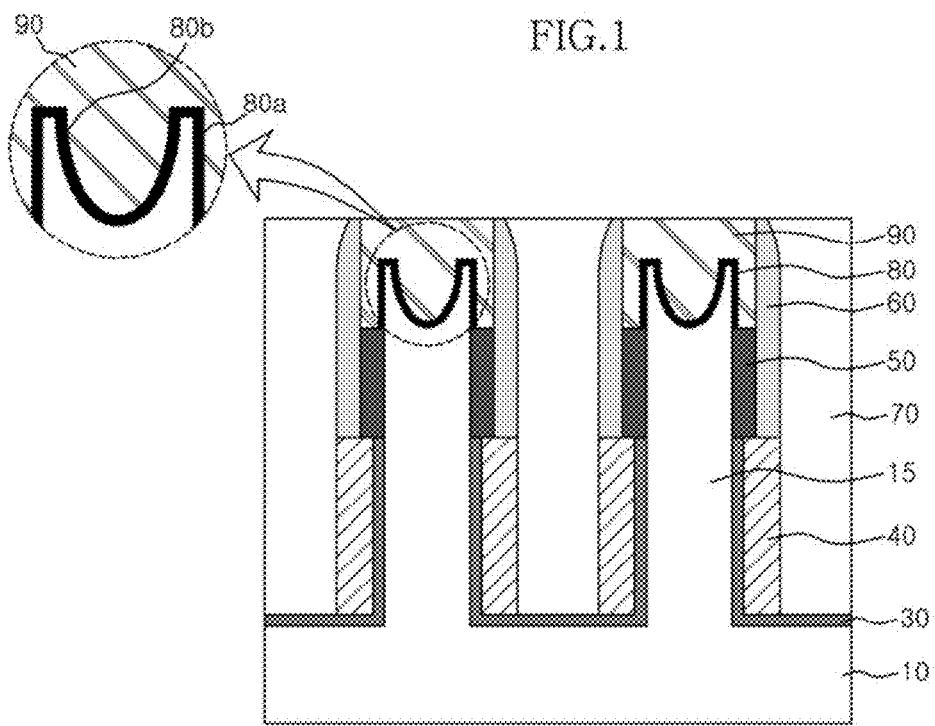
FIG. 1 is a cross-sectional view illustrating a semiconductor device according to an embodiment of the inventive concept.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an Intermediate component. In addition, a singular form may include a plural form as long as it is not specifically mentioned in a sentence.

Although a few embodiments of the inventive concept will be shown and described, it will be appreciated by those of ordinary skill in the art that changes may be made in these exemplary embodiments without departing from the principles and spirit of the inventive concept.

Hereinafter, a PCRAM device will be described as an example of an embodiment of the inventive concept. However, it is obvious by those skilled in the art that the inventive concept may be applied to all nonvolatile memory devices using a resistive material such as resistive RAM (RRAM), a ferroelectric RAM (FRAM) and a magnetic RAM (MRAM).

Referring to FIG. 1, a semiconductor device (a PCRAM) according to an embodiment of the inventive concept may include a vertical transistor structure.

The vertical transistor structure may include a plurality of pillars 15 vertically extending from a semiconductor substrate 10, a gate insulating layer 30 formed on a surface of the semiconductor substrate 10 and surrounding a lower lateral surface of each pillar 15, a gate electrode 40 surrounding the pillar 15 surrounded with the gate insulating layer 30, spacers 50 and 60 surrounding an upper lateral surface of each pillar 15, a silicide layer 80 formed on an upper end of each pillar 15 and a lower electrode 90 surrounding the silicide layer 80 at the upper end of each pillar 15.

As described above, the pillar 15 vertically extends from the semiconductor substrate 10. An upper surface of the pillar 15 may have a groove with a sill that may surround the groove in the upper surface of the pillar 15 as illustrated in FIG. 1.

The gate insulating layer 30 is formed to surround a lateral surface of the pillar 15 to a predetermined height. That is, the gate insulating layer 30 surrounds the lower lateral surface of the pillar 15.

The gate electrode 40 is formed to surround a lateral surface of the gate insulating layer 30.

The spacers 50 and 60 are formed to surround an upper lateral surface of the pillar 15 in which the gate insulating layer 30 and the gate electrode 40 are not formed. The spacers 50 and 60 may include a first spacer 50 formed to surround a portion of the lateral surface of the pillar 15 between the gate electrode 40 and the lower electrode 90 and a second spacer 60 formed to surround lateral surfaces of the first spacer 50 and the lower electrode 90.

The first spacer 50 is provided to surround the portion of the upper lateral surface of the pillar 15 as described above. The first spacer 50 may include a material having the same etch selectivity as or similar etch selectivity to a hard mask pattern 20 shown in FIG. 2A for formation of the pillar 15. For example, the first spacer 50 may include oxide.

The second spacer 60 is formed to cover the lateral surfaces of the first spacer 50 and the lower electrode 90 as described above. The second spacer 60 may include a material having different etch selectivity from the first spacer 50. For example, the second spacer 60 may include nitride.

The salicide layer 80 is formed to cover a lateral circumference of the upper end of the pillar 15 and the upper surface of the pillar 15 having the groove with the sill as described above. That is, the salicide layer 80 may include a first salicide layer 80a formed on the lateral circumference of the upper end of the pillar 15 and a second salicide layer 80b connected to the first salicide layer 80a and formed on the upper surface of the pillar 15 in which the groove with the sill is formed. The second salicide layer 80b may be formed in a U shape as an example of the groove having serifs as an example of the sill as Illustrated in FIG. 1.

Figure 4:
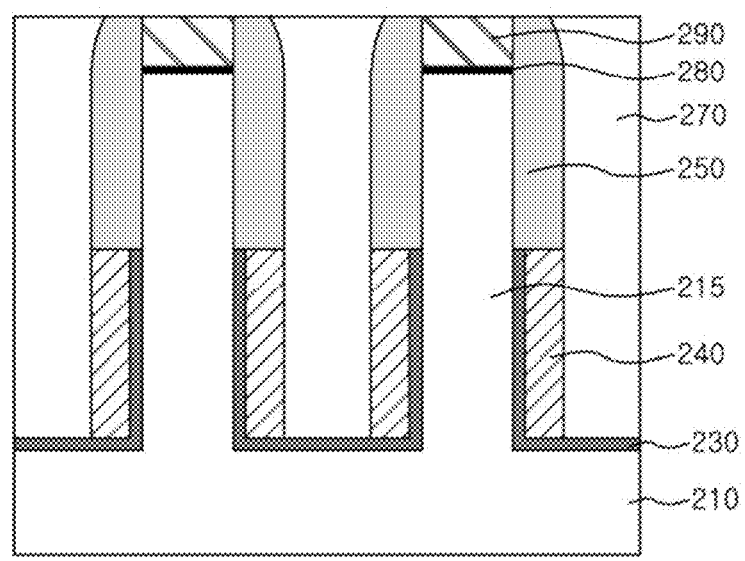
FIG. 4 is a cross-sectional view illustrating a semiconductor device in the related art.

A substantial surface area of the salicide layer 80 may be increased, compared with the device in the related art in which the silicide layer (280 shown in FIG. 4) is formed only on the flat upper surface of the pillar (215 shown in FIG. 4).

That is, according to the embodiment of the inventive concept, a contact area of the salicide layer 80 with the lower electrode 90 is increased by a lateral circumference of the upper end of the pillar 15 and the groove with the sill formed on the upper surface of the pillar, which reduces a contact resistance with the lower electrode 90. The reduced contact resistance with the lower electrode 90 may increase the ON current.

The reference numeral 70 denotes an intercell insulating layer.

Hereinafter, a method for manufacturing a semiconductor device according to an embodiment of the inventive concept will be described with reference to FIGS. 2A to 2I.

Figure 2A:
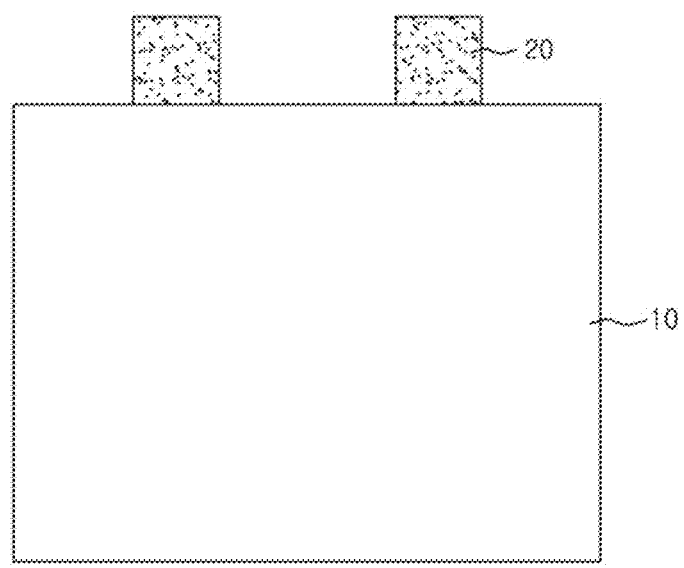
FIGS. 2A to 2I are cross-sectional views illustrating a method for manufacturing a semiconductor device according to an embodiment of the inventive concept.

Referring to FIG. 2A, a hard mask layer (not shown) is deposited on a semiconductor substrate 10. The hard mask layer may be formed of a material having etch selectivity different from the semiconductor substrate 10, for example, a silicon oxide layer. A photoresist pattern (not shown) may be formed on the hard mask layer through a known process and the hard mask layer may be etched using the photoresist pattern as a mask to form the hard mask pattern 20.

Figure 2B:
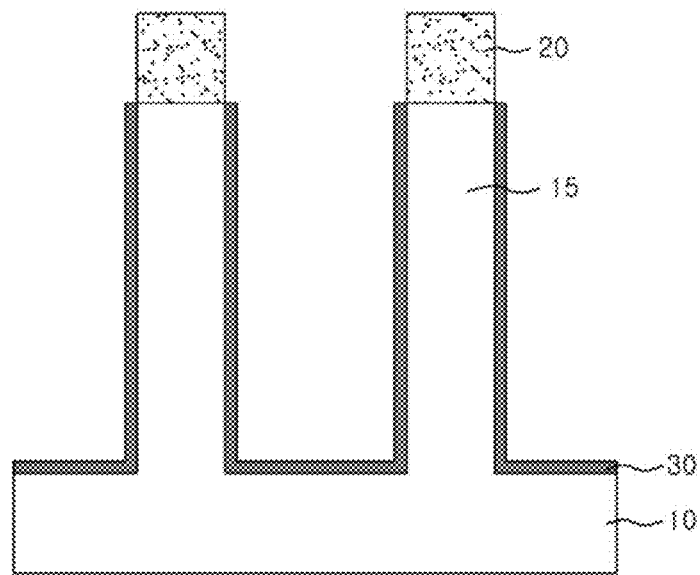

Referring to FIG. 2B, the semiconductor substrate 10 may be etched to a predetermined depth using the hard mask pattern 20 as a mask to form a plurality of pillars 15 in the semiconductor substrate 10.

A gate insulating layer 30 may be formed on the semiconductor substrate 10 including the plurality of pillars 15, that is, on exposed lateral surfaces of each pillar 15 and a surface of the semiconductor substrate between the pillars 15. For example, the gate insulating layer 30 may include a silicon oxide ($SiO_2$) layer, a hafnium oxide ($HfO_2$), a tantalum oxide ($Ta_2O_5$) layer, or an oxide/nitride/oxide (ONO) layer.

After the pillars 15 and the gate insulating layer 30 are formed, impurities may be implanted into the semiconductor substrate 10 to form a source region (not shown).

Figure 2C:
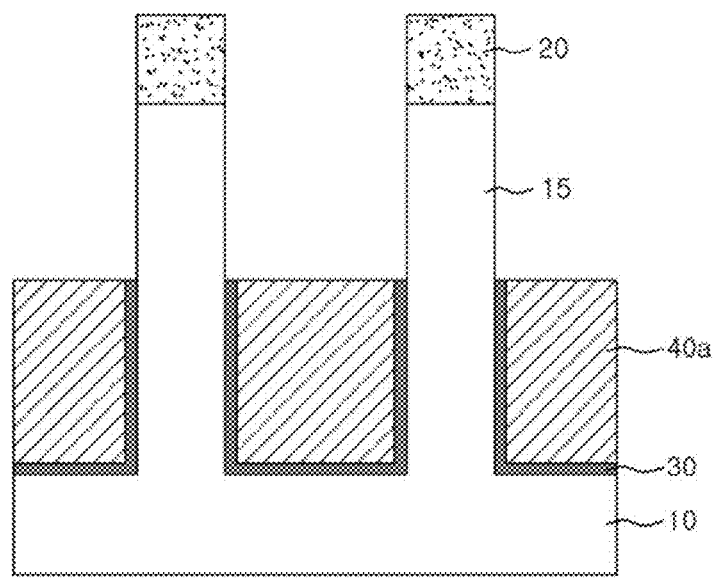

As illustrated in FIG. 2C, a conductive layer 40a may be gap-filled in the semiconductor substrate 10 including the gate insulating layer 30 and then etched back so that the gap-filled conductive material 40a has a predetermined height. In the etching back process, the gate insulating layer 30 may be etched back to have the same height as the gap-filled conductive material 40a.

Figure 2D:
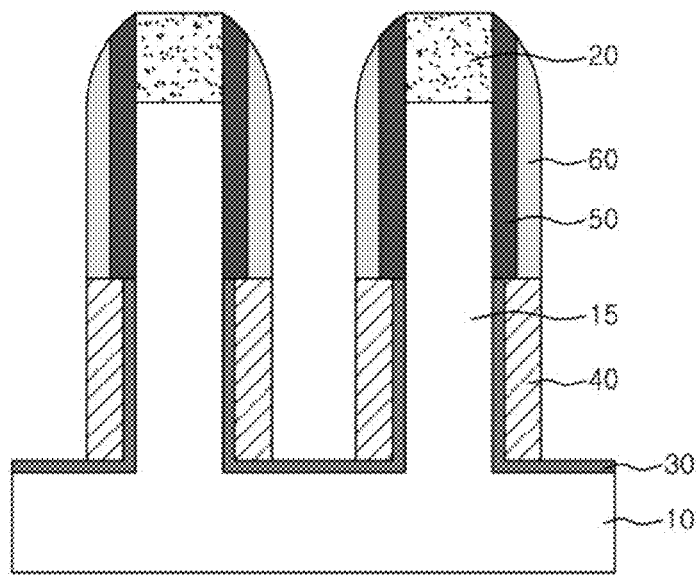

As illustrated in FIG. 2D, a first spacer 50 surrounding an upper lateral surface of the pillar 15 on the conductive material 40a and a lateral surface of the hard mask 20 may be formed. The first spacer 50 may be formed by depositing a first spacer material, for example, an oxide material having the same etch selectivity as or similar etch selectivity to the hard mask pattern 20 along a step of the surface of the process result of forming the conductive material 40a as illustrated in FIG. 2C and then by spacer-etching the deposited first spacer material.

Subsequently, a second spacer 60 may be formed on an outer side of the first spacer 50. The second spacer 60 may be formed by depositing a second spacer material, for example, a material such as a nitride material having different etch selectivity from the first spacer along a step of the surface of the process result of forming the first spacer 50 and then by spacer-etching the deposited second spacer material.

Next, the conductive material 40a illustrated in FIG. 2C may be etched to separate cells, thereby forming a gate electrode 40.

Figure 2E:
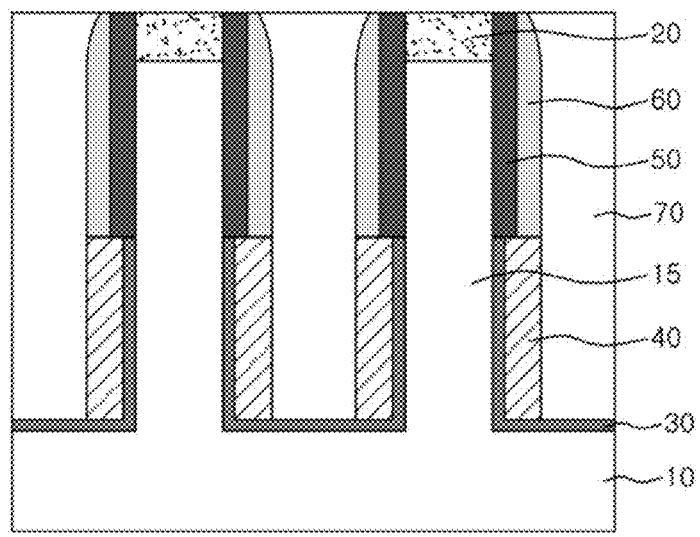

As illustrated in FIG. 2E, a gap-fill insulating material may be formed on the process result of forming the gate electrode 40 and the second spacer 60 as illustrated in FIG. 2D and planarized until an upper surface of the second spacer 60 is exposed to form an intercell insulating layer 70.

Figure 2F:
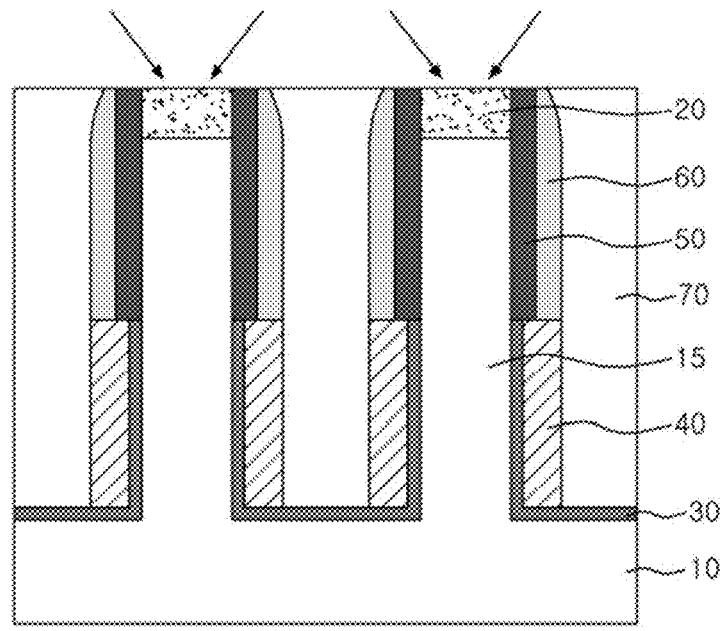

As illustrated in FIG. 2F, the hard mask pattern 20 and an upper portion of the pillar 15 may be doped with impurities to form an impurity region. The doping of the impurities may be performed through tilt ion implantation.

According to an angle of tilt ion implantation in the tilt ion implantation process, the impurities may be doped in a central portion of the upper end of the pillar 15 to the largest depth and the impurities may not be doped in an edge portion of the upper end of the pillar 15. That is, in the pillar 15 of the embodiment, the region doped with the impurities may have different etch selectivity from the other region without the doped impurities.

Figure 2G:
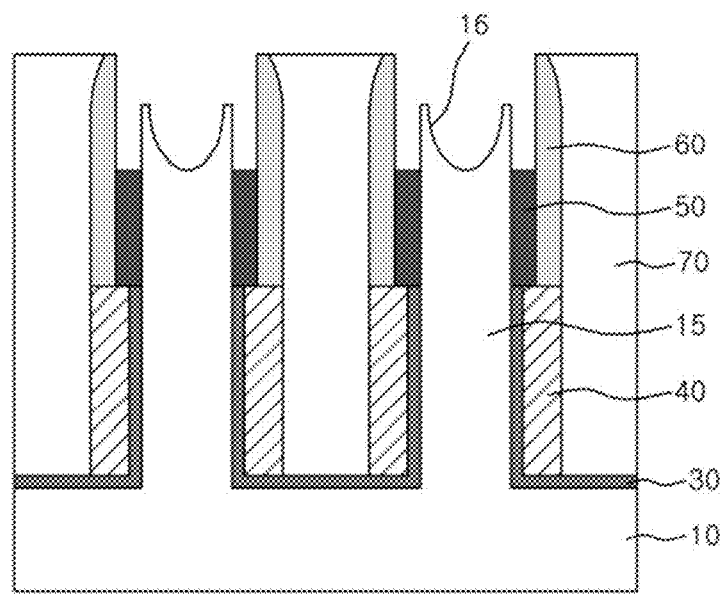

As illustrated in FIG. 2G, the hard mask pattern 20, the region doped with the impurities in the upper end of the pillar 15 and an upper portion of the first spacer 50 may be removed to expose the upper surface and a lateral surface of the upper end of the pillar 15.

The region doped with the impurities may be removed through the removal process to form a groove 16 in the upper surface of the pillar 15. The groove 16 may be formed so that the sill or the flat area around the groove 16 is formed in the upper surface of the pillar 15.

Figure 2H:
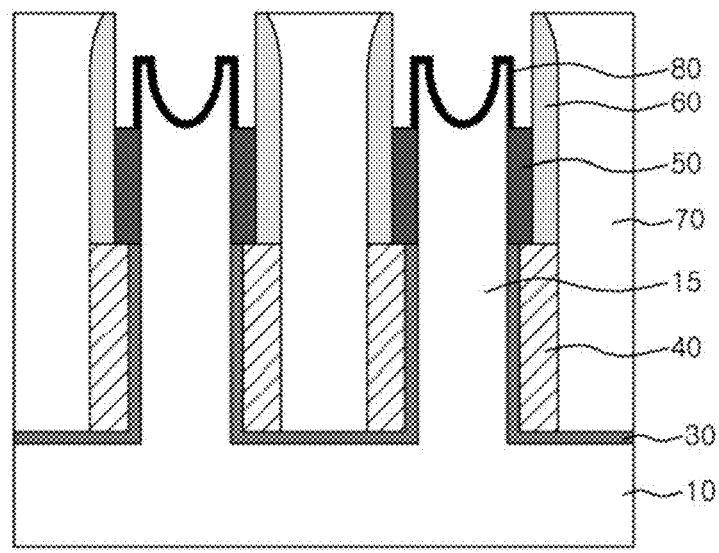

As illustrated in FIG. 2H, a salicide layer 80 may be formed on a lateral circumference of the upper end of the pillar 15 and the upper surface of the pillar 15 in which the groove 16 is formed, which are exposed through the removal process as illustrated in FIG. 2G. That is, the salicide layer 80 may be formed to cover the lateral circumference of the upper end of the pillar 15 and the upper surface of the pillar 15 having the groove 16 and the sill.

Hereinafter, the process of forming the salicide layer 80 will be described.

A salicide formation material (not shown) may be deposited in a space formed by removing the hard mask pattern 20 and the upper portion of the first spacer 50 from the process result of forming the groove 16 and the sill as Illustrated in FIG. 2G. For example, the salicide formation material may include a transition metal layer such as cobalt (Co), titanium (Ti), nickel (Ni), or tungsten (W).

A heat treatment may be performed to allow the pillar 15 to react with the salicide formation material. The reaction occurs in a direct contact portion of the salicide formation material with the pillar 15 so that a self-aligned silicide layer, that is, the salicide layer 80 may be formed through selective reaction between silicon and metal.

A portion of the salicide formation material, which is not transformed into the salicide layer 80, may be removed through a known method.

Figure 2I:
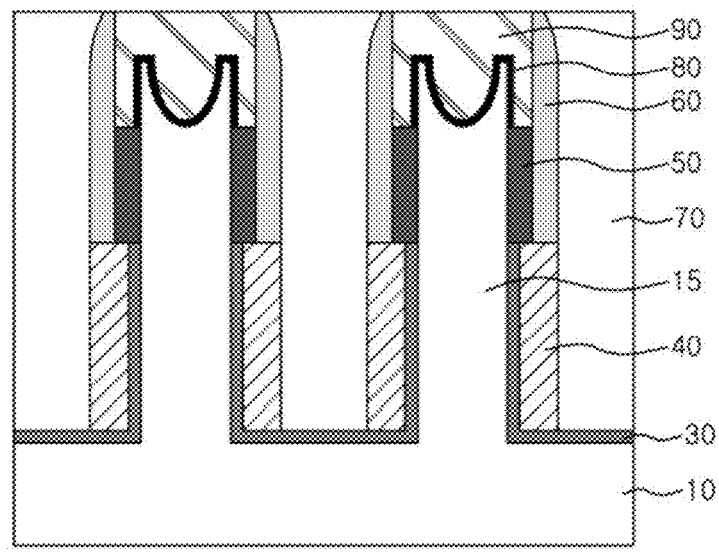

As illustrated in FIG. 2I, a lower electrode 90 may be formed on the pillar 15 on which the salicide layer 80 is formed. The lower electrode 90 may be formed by depositing a conductive material on the process result of forming the salicide layer 80 as illustrated in FIG. 2H and then by etching back and planarizing the deposited conductive material. The conductive material for the lower electrode 90 may include a material such as titanium nitride (TiN), tantalum nitride (TaN), tungsten nitride (WN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium (Ti), tungsten (W), molybdenum (Mo), tantalum (Ta), titanium silicide (TiSi), tantalum silicide (TaSi), titanium oxynitride (TiON), titanium aluminum oxynitride (TiAlON), tungsten oxynitride (WON), and tantalum oxynitride (TaON).

A phase-change layer (not shown) and an upper electrode (not shown) may be formed on the lower electrode 90 to complete the semiconductor device.

Hereinafter, a method for manufacturing a semiconductor device according to another embodiment of the inventive concept will be described with reference to FIGS. 3A to 3L.

Figure 3A:
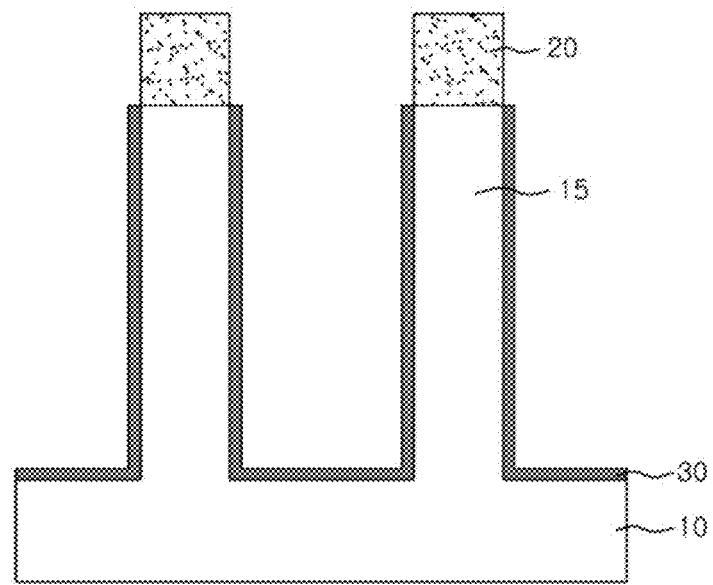
FIGS. 3A to 3L are cross-sectional views illustrating a method for manufacturing a semiconductor device according to another embodiment of the inventive concept.

Referring to FIG. 3A, a first hard mask pattern 20 may be formed on a semiconductor substrate 10 and the semiconductor substrate 10 may be etched to a predetermined depth using the first hard mask pattern 20 as a mask to form a plurality of pillars 15.

The first hard mask pattern 20 may be formed by depositing a hard mask layer (not shown) having etch selectivity different from the semiconductor substrate 10, for example, a silicon oxide layer on the semiconductor substrate 10, forming a photoresist pattern (not shown) on the hard mask layer through a known process and etching the hard mask layer using the photoresist pattern as a mask.

A gate insulating layer 30 may be formed on the semiconductor substrate 10 including the plurality of pillars 15, that is, on an exposed lateral surface of each pillar 15 and an exposed surface of the semiconductor substrate between the pillars 15. For example, the gate insulating layer 30 may include a silicon oxide ($SiO_2$) layer, a hafnium oxide layer ($HfO_2$), a tantalum oxide ($Ta_2O_5$) layer, or an oxide/nitride/oxide (ONO) layer.

After the pillars 15 and the gate insulating layer 30 are formed, impurities may be implanted into the semiconductor substrate 10 to form a source region (not shown).

Figure 3B:
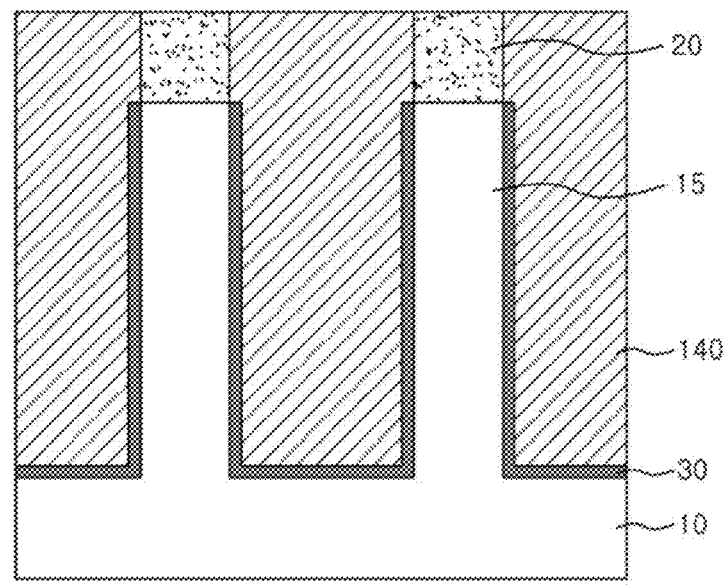

As illustrated in FIG. 3B, a conductive layer 140 may be gap-filled in the semiconductor substrate including the gate insulating layer 30 and then planarized until an upper surface of the first hard mask pattern 20 is exposed.

Figure 3C:
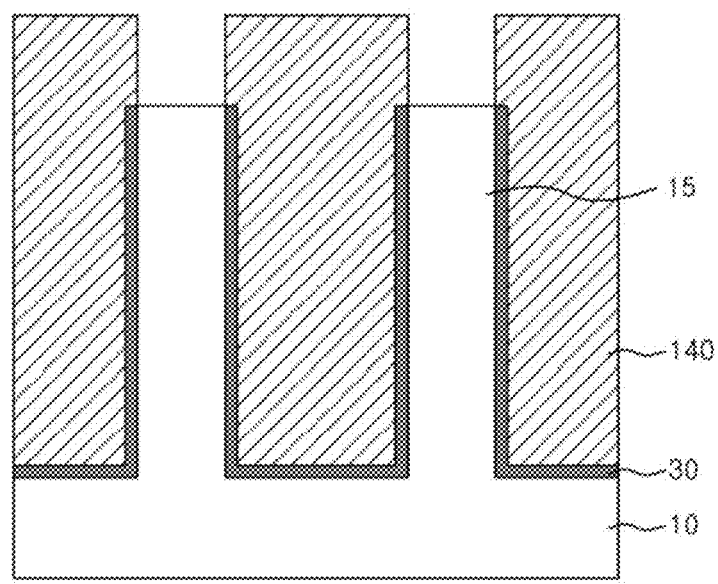

As illustrated in FIG. 3C, the first hard mask pattern 20 may be removed from the semiconductor substrate including the conductive pattern 140 as illustrated in FIG. 3B. For example, the removal of the first hard mask pattern 20 may be performed through a dip out process.

Figure 3D:
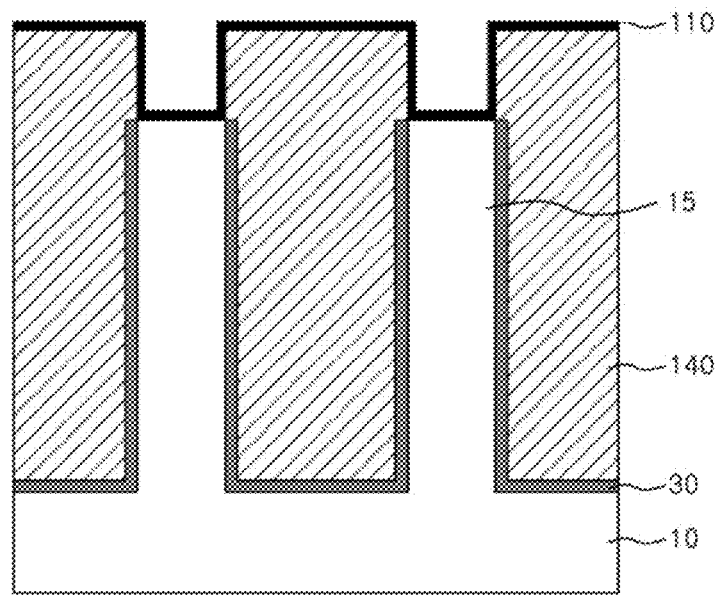
Figure 3E:
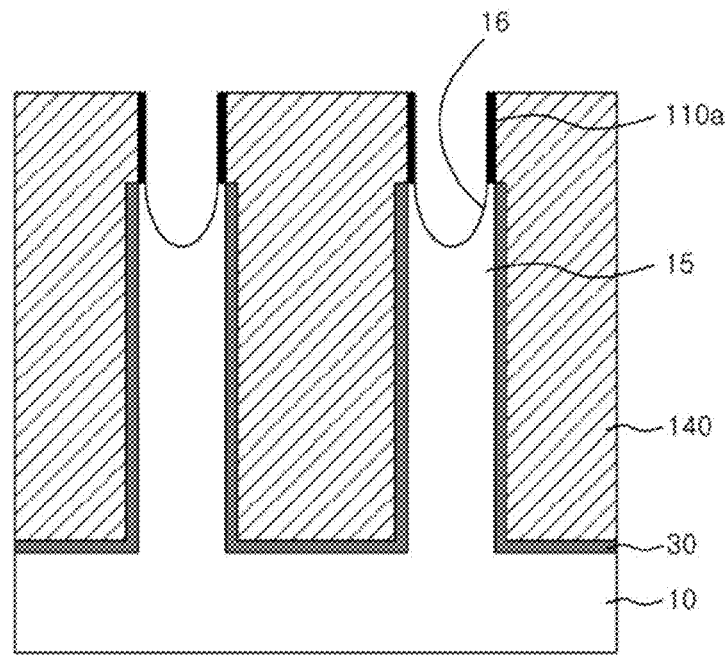

As illustrated in FIG. 3D, an insulating material 110, for example, a nitride material having different etch selectivity from the first hard mask pattern 20 may be deposited on entire surface of the process result of removing the first hard mask pattern 20 as illustrated in FIG. 3C. As illustrated in FIG. 3E, the insulating material 110 may be spacer-etched to form a temporary spacer 110a.

In the process of spacer-etching the insulating material 110, a groove 16 may be formed in an upper surface of the pillar 15. The groove 16 may be formed so that the temporary spacer 110a is located around the groove 16 on the upper surface of the pillar 15.

Figure 3F:
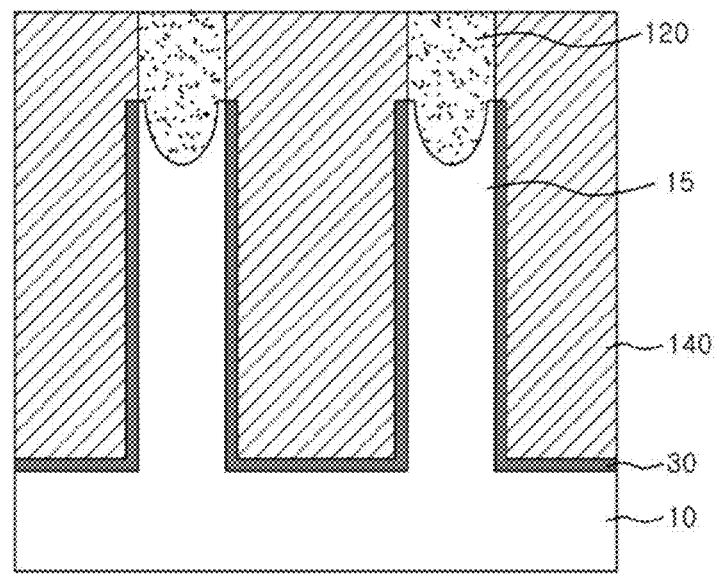

As illustrated in FIG. 3F, the temporary spacer 110a may be removed so that a sill or a flat area around the groove 16 is formed on the upper surface of the pillar 15. A second hard mask material (not shown) may be deposited on the semiconductor substrate including the groove 16 and then planarized until an upper surface of the conductive material 140 is exposed to form the second hard mask pattern 120.

The second hard mask pattern 120 may be formed on the upper surface of the pillar 15 including the groove 16 as illustrated in FIG. 3E.

Figure 3G:
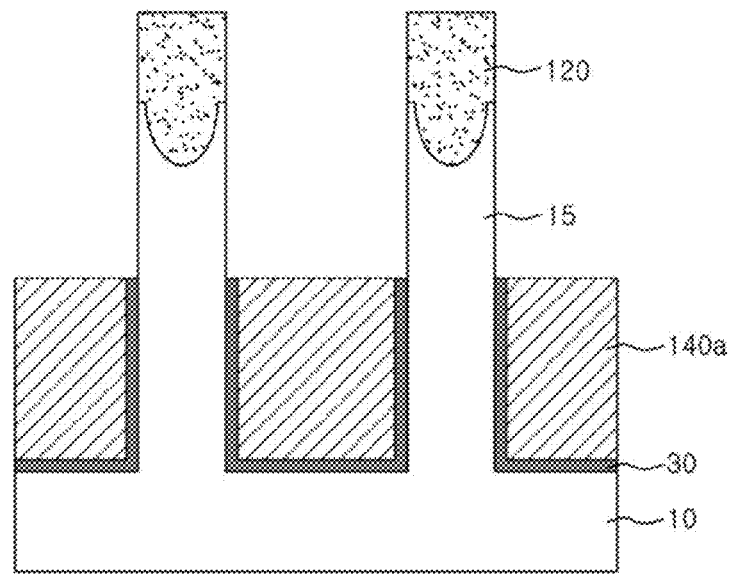

As illustrated in FIG. 3G, the conductive layer 140 may be etched back to have a predetermined height. In the etching back of the conductive layer 140, the gate insulating layer 30 may be etched back to have the same height as the conductive material 140a etched-back.

Figure 3H:
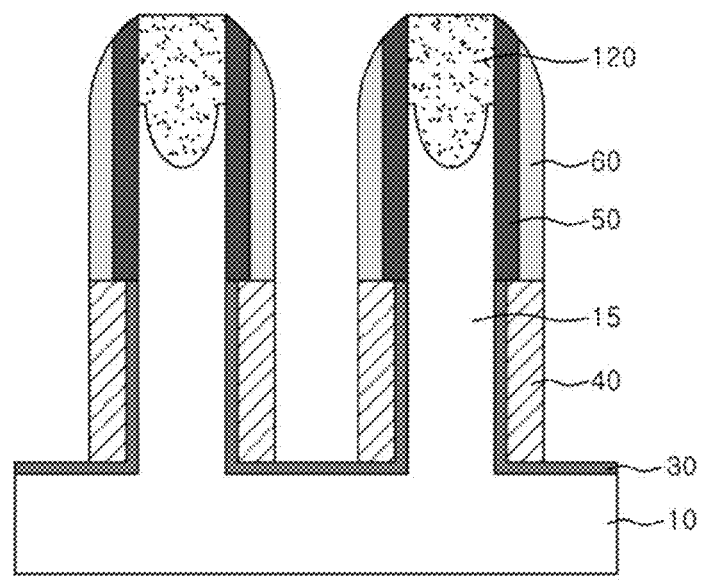

As illustrated in FIG. 3H, a first spacer 50 surrounding a lateral surface of the pillar 15 on the conductive material 140a and a lateral surface of the hard mask 120 may be formed. The first spacer 50 may be formed by depositing a first spacer material (not shown), for example, an oxide material having the same etch selectivity as or similar etch selectivity to the second hard mask pattern 120 along a step of an upper surface of the semiconductor substrate having the etched back conductive layer 140a as illustrated in FIG. 3G and then by spacer-etching the deposited first spacer material.

Subsequently, a second spacer 60 may be formed on an outer side of the first spacer 50. The second spacer 60 may be formed by depositing a second spacer material, for example, a material such as a nitride material having different etch selectivity from the first spacer 50 along a step of the upper surface of the semiconductor substrate including the first spacer 50 and then by spacer-etching the deposited second spacer material.

Next, the conductive material 140a illustrated in FIG. 3G may be etched to separate cells, thereby forming a gate electrode 40.

Figure 3I:
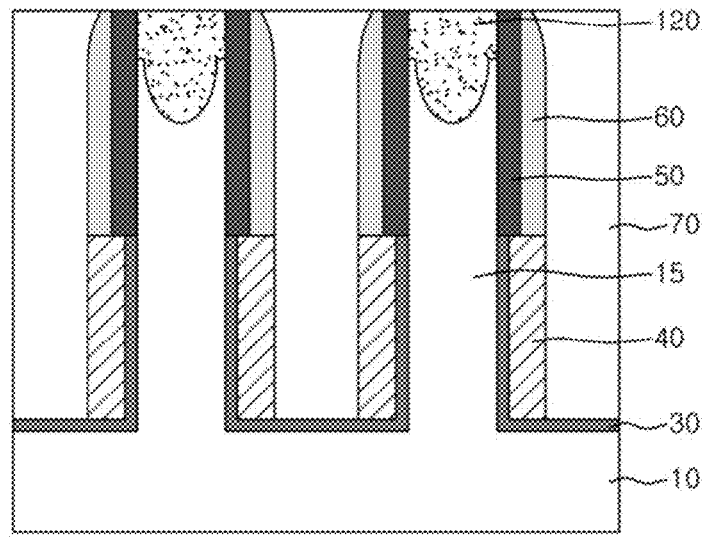

As illustrated in FIG. 3I, a gap-fill insulating material may be formed on the semiconductor substrate including the gate electrode 40 as illustrated in FIG. 3H and planarized until an upper surface of the second spacer 60 is exposed to form an intercell insulating layer 70.

Figure 3J:
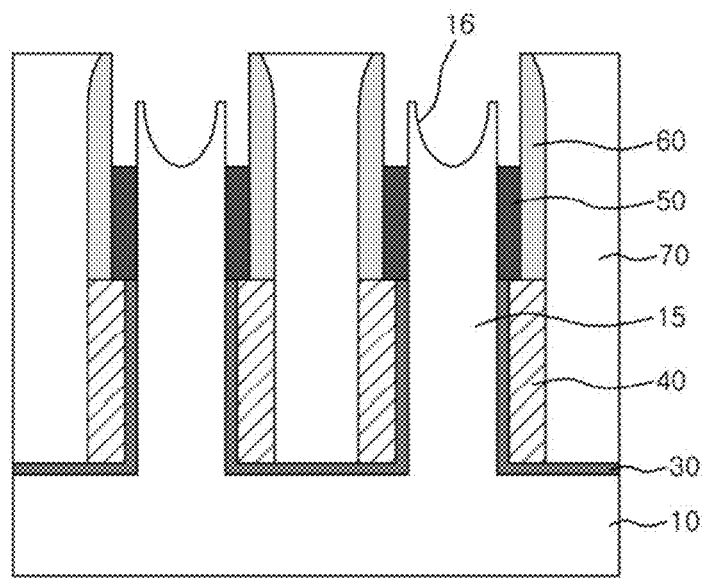

As illustrated in FIG. 3J, the second hard mask pattern 120 and an upper portion of the first spacer 50 may be removed to expose the upper surface and a lateral surface of an upper end of the pillar 15.

As the groove 16 and the sill or the flat area around the groove 16 is formed in the upper surface of the pillar 15, the upper surface of the pillar 15 may be formed with the groove 16 and the sill or the flat area around the groove 16 in the removal process of the second hard mask pattern 120 and an upper portion of the first spacer 50 as illustrated in FIG. 3J.

Figure 3K:
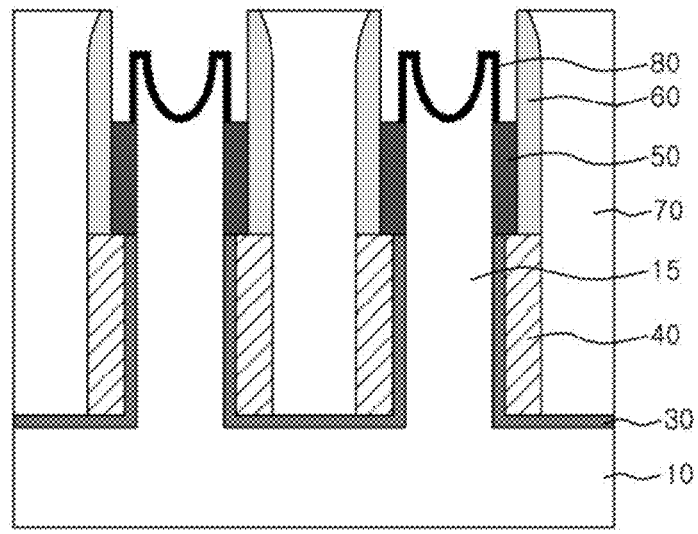

As illustrated in FIG. 3K, a salicide layer 80 may be formed on a lateral circumference of the upper end of the pillar 15 and the upper surface of the pillar 15 in which the groove 16 is formed, which are exposed through the removal process as illustrated in FIG. 3J. That is, the salicide layer 80 may be formed to cover a lateral circumference of an upper end of the pillar 15 and the upper surface of the pillar 15 having the groove 16 and the sill.

Figure 3L:
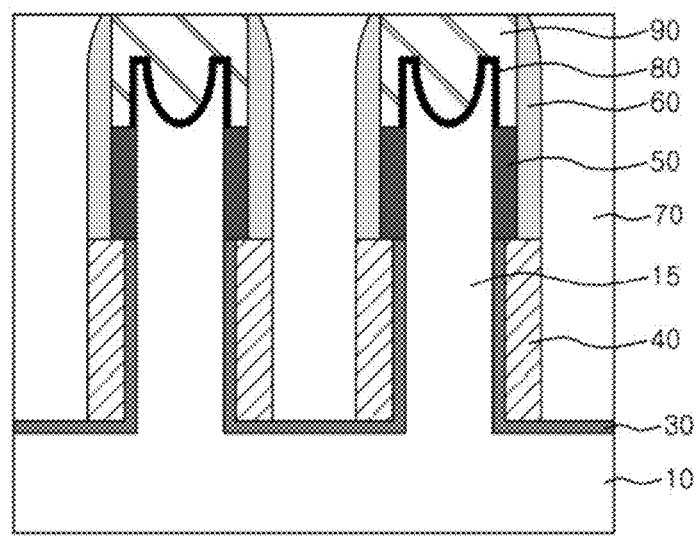

As illustrated in FIG. 3L, a lower electrode 90 may be formed on the pillar 15 on which the salicide layer 80 is formed. The lower electrode 90 may be formed by depositing a conductive material (not shown) on the semiconductor substrate including the salicide layer 80 as illustrated in FIG. 3K and then by etching back and planarizing the deposited conductive material.

Subsequently, a phase-change layer (not shown) and an upper electrode (not shown) may be formed on the lower electrode 90 to complete the semiconductor device.

In the semiconductor device manufactured through the above-described manufacturing method, as a salicide layer formed between a pillar and a lower electrode is formed on a upper surface of the pillar having a groove with a sill or a flat area around the groove and a lateral circumference of an upper end of the pillar, a substantial surface area of the salicide layer may be increased as compared with a device in the related art. Therefore, in the embodiment of the inventive concept, a contact area of the salicide layer with the lower electrode may be increased and thus a contact resistance with the lower electrode may be reduced. The reduced contact resistance with the lower electrode increases the ON current.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   a semiconductor substrate;
   a plurality of pillars vertically extending from the semiconductor substrate, each pillar including a groove formed in an upper surface thereof;
   a self-aligned silicide (salicide) layer formed to cover the upper surface and a lateral circumference of an upper end of each pillar; and
   a lower electrode formed to cover an upper surface and a lateral surface of the salicide layer.

2. The semiconductor device of claim 1, wherein the groove is a central portion of the upper surface of each pillar that is depressed.

3. The semiconductor device of claim 2, wherein the salicide layer includes a first salicide layer formed on the lateral circumference of the upper end of each pillar and a second salicide layer formed on the upper surface of each pillar, in which the groove and a sill that is a flat area around the groove are formed, and connected to the first salicide layer.

4. A method for manufacturing a semiconductor device, the method comprising:
   preparing a semiconductor substrate including a plurality of pillars using a first hard mask pattern;
   forming a groove in an upper surface of each pillar;
   forming a self-aligned silicide (silicide) layer covering the upper surface of each pillar, in which the groove is formed and a lateral circumference of an upper end of each pillar; and
   forming a lower electrode covering the salicide layer.

5. The method of claim 4, further comprising: after the preparing of the semiconductor substrate,
   forming a first spacer surrounding a lateral surface of the first hard mask pattern and an upper lateral surface of each pillar; and
   doping impurities into the upper surface of each pillar through tilt ion implantation.

6. The method of claim 5, wherein the forming of the groove includes exposing a lateral surface of the upper end of each pillar and the upper surface of each pillar by removing an upper portion of the first spacer, the first hard mask pattern and a portion of the upper end of each pillar doped with the impurities.

7. The method of claim 6, wherein the groove is a central portion of the upper surface of each pillar that is depressed.

8. The method of claim 7, wherein the forming of the salicide layer includes forming the salicide layer to cover the lateral circumference of the upper end of each pillar exposed by removing the upper portion of the first spacer and the upper surface of each pillar including the groove formed by removing the portion of the upper end of each pillar doped with the impurities.

9. The method of claim 8, wherein the first hard mask pattern, the first spacer and the portion of the upper end of each pillar doped with the impurities have the same or similar etch selectivity to one another.

10. The method of claim 5, further comprising, before the forming of the first spacer, forming a gate electrode on a circumference of a lower lateral surface of each pillar.

11. The method of claim 4, further comprising: after the preparing of the semiconductor substrate,
   gap-filling a conductive material in the semiconductor substrate including the plurality of pillars and planarizing the conductive material until an upper surface of the first hard mask pattern is exposed,
   removing the first hard mask pattern; and
   depositing on an insulating layer on the semiconductor substrate from which the first hard mask pattern is removed.

12. The method of claim 11, wherein the forming of the groove includes spacer-etching the insulating layer to form a temporary spacer on each pillar from which the hard mask pattern is removed and wherein the groove is formed in the upper surface of each pillar in the spacer-etching of the insulating layer.

13. The method of claim 12, wherein the groove is formed in a depressed shape at a central portion of the upper surface of each pillar in the spacer-etching of the insulating layer.

14. The method of claim 13, further comprising: after the forming of the groove,
- removing the temporary spacer;
- forming a second hard mask pattern on each pillar in which the groove is formed;
- etching back the conductive material to have a predetermined height;
- forming a first spacer to surround an upper lateral surface of each pillar on the etched back conductive material; and
- removing the second hard mask pattern and an upper portion of the first spacer to expose the upper surface and the lateral surface of the upper end of each pillar.

15. The method of claim 14, wherein the forming of the salicide layer includes forming the salicide layer to cover the lateral circumference of the upper end of each pillar exposed by removing the upper portion of the first spacer and the upper surface including the groove and a sill that is a flat area around the groove exposed by removing the second hard mask pattern.

16. The method of claim 15, wherein the second hard mask pattern and the first spacer have the same etch selectivity as or similar etch selectivity to each other.

* * * * *